(12) United States Patent
King et al.

(45) Date of Patent: Sep. 3, 2013

(10) Patent No.: US 8,524,597 B2

(54) METHODS FOR FORMING PLANARIZED HERMETIC BARRIER LAYERS AND STRUCTURES FORMED THEREBY

(75) Inventors: Sean W. King, Beaverton, OR (US); Hui Jae Yoo, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 13/276,062

(22) Filed: Oct. 18, 2011

(65) Prior Publication Data

US 2012/0122312 A1 May 17, 2012

Related U.S. Application Data

(62) Division of application No. 12/948,410, filed on Nov. 17, 2007, now Pat. No. 8,039,920.

(51) Int. Cl.
*H01L 21/4763* (2006.01)

(52) U.S. Cl.
USPC ............ 438/627; 463/643; 463/653; 257/486; 257/751

(58) Field of Classification Search
USPC .................. 438/627, 643, 653; 257/486, 751
See application file for complete search history.

(56) References Cited

U.S. PATENT DOCUMENTS

| | | | |
|---|---|---|---|
| 5,656,337 A * | 8/1997 | Park et al. ................... | 427/539 |
| 5,693,563 A | 12/1997 | Teong | |
| 6,016,000 A * | 1/2000 | Moslehi ....................... | 257/522 |
| 6,147,000 A | 11/2000 | You et al. | |
| 6,255,217 B1 | 7/2001 | Agnello et al. | |
| 6,958,542 B2 | 10/2005 | Hasunuma et al. | |
| 7,037,835 B2 | 5/2006 | Lee et al. | |
| 7,088,003 B2 * | 8/2006 | Gates et al. .................. | 257/774 |
| 7,193,323 B2 | 3/2007 | Cabral, Jr. et al. | |
| 7,223,692 B2 | 5/2007 | Lin et al. | |
| 7,256,499 B1 * | 8/2007 | You et al. ..................... | 257/758 |
| 7,288,205 B2 * | 10/2007 | Lakshmanan et al. ........ | 216/67 |
| 7,372,158 B2 * | 5/2008 | Wang et al. .................. | 257/760 |
| 7,871,922 B2 | 1/2011 | Liu et al. | |
| 7,915,166 B1 * | 3/2011 | Yu et al. ....................... | 438/687 |
| 2008/0001292 A1 | 1/2008 | Zelner et al. | |
| 2008/0197513 A1 * | 8/2008 | Restaino et al. ............. | 257/784 |

(Continued)

FOREIGN PATENT DOCUMENTS

| | | |
|---|---|---|
| KR | 10-2004-0058952 A | 7/2004 |
| WO | 2012/067955 A2 | 5/2012 |
| WO | 2012/067955 A3 | 8/2012 |

OTHER PUBLICATIONS

International Search Report and Written Opinion received for PCT Patent Application No. PCT/US2011/060304, mailed on May 10, 2012, 11 pages.

(Continued)

*Primary Examiner* — Jarrett Stark
*Assistant Examiner* — Nicholas Tobergte
(74) *Attorney, Agent, or Firm* — Forefront IP Lawgroup, PLLC

(57) ABSTRACT

Methods and associated structures of forming a microelectronic structure are described. Those methods may comprise forming a conductive material in an interconnect opening within an interlayer dielectric material that is disposed on a substrate, forming a low density dielectric material on a surface of the dielectric layer and on a surface of the conductive material, and forming a high density dielectric barrier layer on the low density dielectric layer.

10 Claims, 8 Drawing Sheets

(56) References Cited

U.S. PATENT DOCUMENTS

2009/0173949 A1 7/2009 Yatsuo et al.
2010/0164074 A1* 7/2010 King .............................. 257/635
2010/0219533 A1 9/2010 Ootake et al.

OTHER PUBLICATIONS

International Preliminary Report on Patentability received for PCT Application No. PCT/US2011/060304, issued on May 21, 2013, 7 pages.

* cited by examiner

US 8,524,597 B2

METHODS FOR FORMING PLANARIZED HERMETIC BARRIER LAYERS AND STRUCTURES FORMED THEREBY

BACKGROUND OF THE INVENTION

In the manufacture of microelectronic circuits, interconnect structures may be formed on a substrate using a dual damascene process, for example. Such a process may include trench and via openings being formed in an interlayer dielectric (ILD) material, which are then filled with a conductive material, such as copper, for example. A barrier layer may then be formed on the conductive material and on the ILD, which may act as an etch stop/barrier layer during further processing, for example.

BRIEF DESCRIPTION OF THE DRAWINGS

While the specification concludes with claims particularly pointing out and distinctly claiming that which is regarded as the present invention, the advantages of this invention can be more readily ascertained from the following description of the invention when read in conjunction with the accompanying drawings in which:

DETAILED DESCRIPTION OF THE PRESENT INVENTION

Figure 1A:
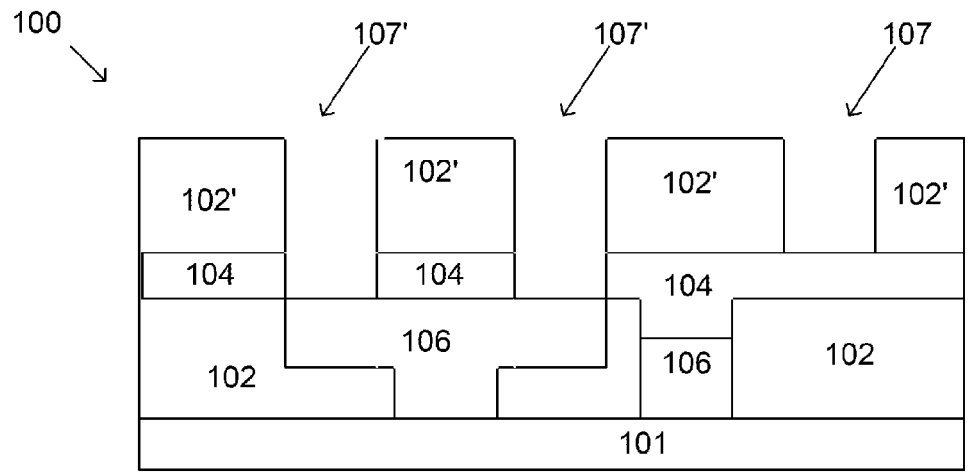
FIGS. 1a-1m represent cross-sections of structures that may be formed when carrying out an embodiment of the methods of the present invention.

In the following detailed description, reference is made to the accompanying drawings that show, by way of illustration, specific embodiments in which the embodiments may be practiced. These embodiments are described in sufficient detail to enable those skilled in the art to practice the embodiments. It is to be understood that the various embodiments, although different, are not necessarily mutually exclusive. For example, a particular feature, structure, or characteristic described herein, in connection with one embodiment, may be implemented within other embodiments without departing from the spirit and scope of the embodiments. In addition, it is to be understood that the location or arrangement of individual elements within each disclosed embodiment may be modified without departing from the spirit and scope of the embodiments. The following detailed description is, therefore, not to be taken in a limiting sense, and the scope of the embodiments is defined only by the appended claims, appropriately interpreted, along with the full range of equivalents to which the claims are entitled. In the drawings, like numerals refer to the same or similar functionality throughout the several views.

Methods and associated structures of forming microelectronic structures, such as barrier layer structures, are described. Those methods may comprise forming a conductive material in an interconnect opening within an interlayer dielectric material that is disposed on a substrate, forming a low density dielectric material on a surface of the dielectric layer and on a surface of the conductive material, and forming a high density dielectric barrier layer on the low density dielectric layer. The barrier layers of the embodiments enable the reduction of the impact of the barrier layers on the overall capacitance of interconnect structure disposed in microelectronic devices utilizing the barrier layers of the embodiments, for example.

In an embodiment, a microelectronic structure 100, such as a portion of a Damascene structure 100 of a microelectronic device, for example, may comprise a substrate 101 (FIG. 1a). The substrate 101 may comprise materials such as silicon, silicon-on insulator, germanium, indium antimonide, lead telluride, indium arsenide, indium phosphide, gallium arsenide, gallium antimonide, silicon carbide, aluminum nitride, and diamond. Although several examples of materials from which the substrate 101 may be formed are described here, any material that may serve as a portion of a foundation upon which a microelectronic device may be built, for example, falls within the spirit and scope of the present invention.

The structure 100 may comprise a lower interlayer dielectric (ILD) material 102, and an upper ILD material 102'. In an embodiment, the upper and lower ILD's 102, 102' may comprise low dielectric constant materials. In some cases, the upper and lower ILD materials may comprise such materials as silicon dioxide (comprising a k value of about 4.0) silicon oxyflouride (comprising a k value of about 3.8 to about 3.6), and SiOC:H (comprising a k value of about 3.1 or less). In an embodiment, upper and lower ILD material 102', 102 may include portions of a first and a second metal layer. A barrier layer 104, which may comprise a dielectric barrier layer 104, may be disposed above the lower dielectric layer 102 and below the upper ILD material 102'. In some embodiments, the barrier layer 104 may or may not be disposed between the upper ILD 102' and the lower ILD 102.

A lower conductive material 106, which may comprise a conductive copper trace in some embodiments, may be disposed adjacent the lower dielectric layer 102. It will be understood by those skilled in the art that the exact location of the various dielectric layers/films and conductive material/traces that may be disposed on the substrate 101 may vary according to the particular design requirements of the structure 100. The structure 100 may further comprise at least one interconnect opening 107 that may extend partially through dielectric layer 102', and may comprise a copper interconnect opening 107, such as a but not limited to a Damascene structure interconnect opening 107, for example. In other embodiments, opening 107 may extend completely through dielectric layer 102' and stop on dielectric barrier layer 104. In addition to opening 107, the structure 100 may also include openings 107' which may extend fully through dielectric 102' and barrier 104 to form a via exposing the underlying conductive material/traces 106 that are inlaid in dielectric 102.

Figure 1B:
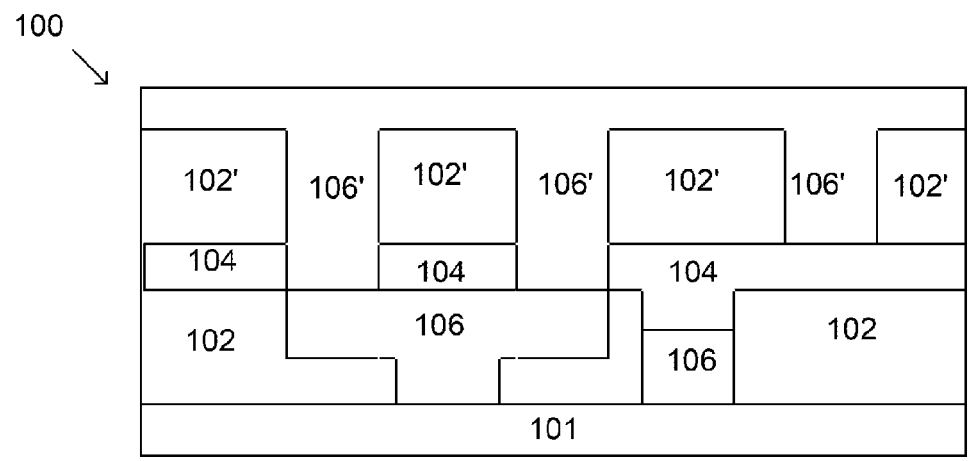
Figure 1C:
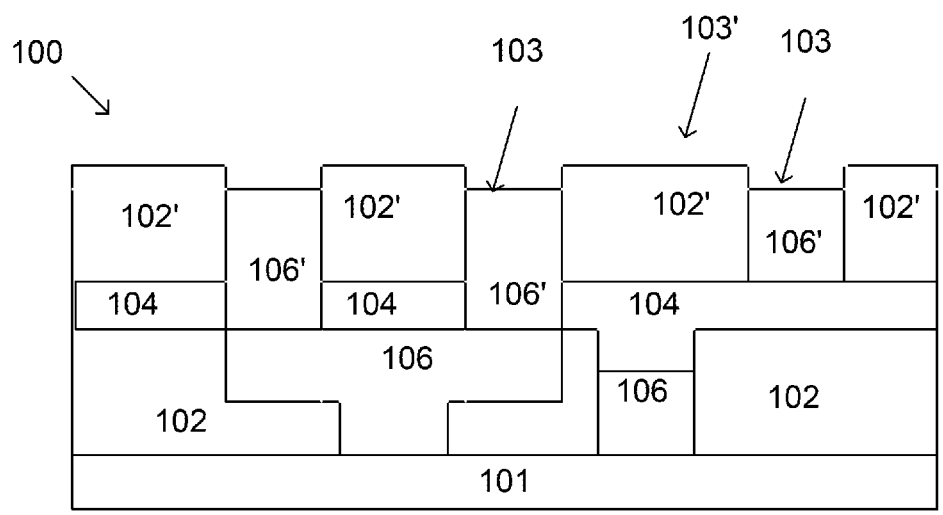

In an embodiment, a conductive material 106', which may comprise a material comprising metal in some cases, may be formed in at least one or both of the openings 107 and 107' (FIG. 1b). In an embodiment, the conductive material 106' may comprise a conductive metal trace 106', such as a copper conductive trace 106' (FIG. 1b). In an embodiment, copper lines and vias may be formed in the upper ILD material 102' on the substrate 101 using such techniques as plasma enhanced chemical vapor deposition (PECVD), lithography/patterning techniques, plasma etching, and copper deposition methods, as are known in the art. In an embodiment, a portion of the conductive material 106' may be removed, by utilizing a removal process such as but not limited to chemical mechanical polishing (CMP), for example (FIG. 1c). Thus, the structure 100 of FIG. 1c may comprise copper lines 106' inlaid in upper ILD material 102'. In an embodiment, a top surface 103 of the conductive material 106' and a top surface 103' of the ILD 102' adjacent the top surface 103 of the conductive material 106' may be exposed after the CMP process.

Figure 1D:
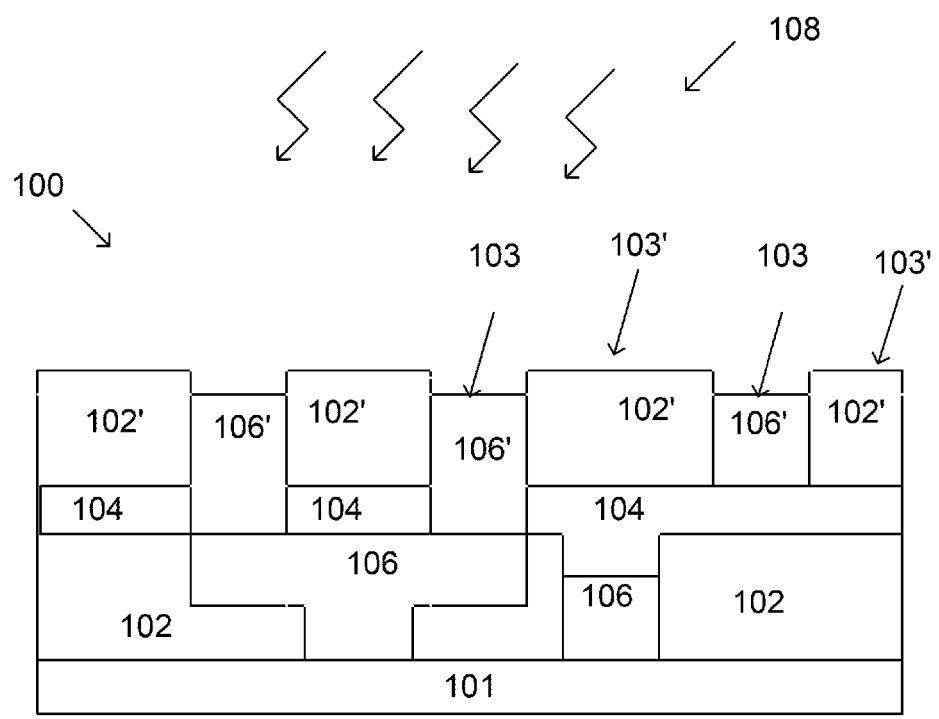

The structure 100 comprising the exposed top surface 103 of the conductive material 106' and the exposed top surface 103' of the ILD 102' may be exposed to a plasma pre-treatment 108 (FIG. 1d). In an embodiment, the plasma pre-treatment 108 may be performed using plasma activated H2, NH3, N2 or Ar species. The plasma pre-treatment 108 may be performed to eliminate residue that may remain on the top surface 103 of the conductive material 106, 106' and on the top surface 103' of the ILD 102' from the CMP removal process, such as copper residues and corrosion inhibitors. The plasma pre-clean 108 may also serve to reduce any oxides, such as copper oxides, that may be present on the surfaces 103' 103 of the ILD 102' and the conductive material 106'.

Figure 1E:
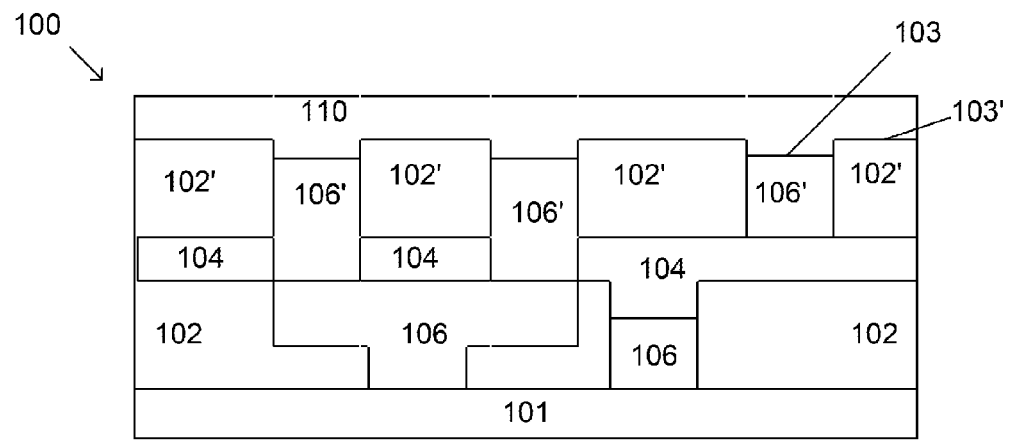

A low density dielectric material 110 may be formed on the top surfaces 103, 103' of the conductive material 106' and the ILD 102' (FIG. 1e). In an embodiment, the low density dielectric material 110 may be formed by such techniques as PECVD (or any other suitable method) on the conductive material 106' and on the ILD material 102' surfaces. In an embodiment, the density of the low density material 110 may comprise about 1.5 g/cm$^3$ or less. In an embodiment, the density may comprise less than about 1.35 g/cm$^3$. In an embodiment, the dielectric constant of the low density dielectric material 110 may comprise a range from about 2.5 to about 4.0, and in some cases may comprise less than about 3.3. In an embodiment, the low density dielectric material 110 may comprise such material as SiC:H, SiCN:H, SiOC:H, SiNx:H, SiC:H, SiBN, BN, and AlN. The low density dielectric material 110 may serve to reduce and or eliminate any surface topography/roughness present on the surfaces 103, 103' of the conductive material 106' and the ILD 102'. In an embodiment, a thickness of the low density dielectric material may comprise about 4 nm to about 25 nm, and in some cases may comprise a thickness of about 8 nm and above.

Figure 1F:
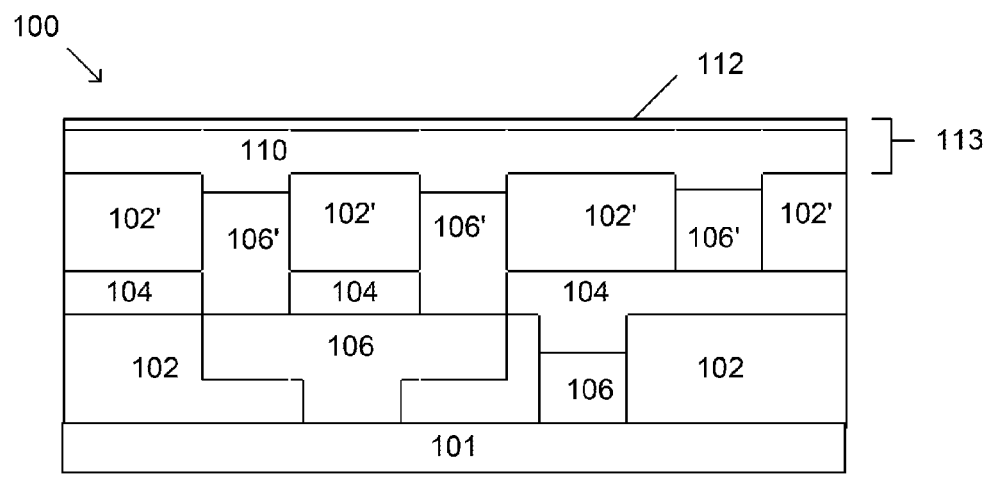

A high density dielectric barrier 112 layer may be formed on top of the low density/low-k dielectric layer 110 (FIG. 1f). A thickness of the high density barrier 112 may comprise a fraction of a thickness of the low density material 110, and in some cases may comprise a thickness of less than about ¼ of the thickness of the low density dielectric material 110. In an embodiment, the high density barrier layer 112 may comprise a fraction of the thickness that would be used without forming the low density barrier layer 110 beneath the high density barrier layer 112. In an embodiment the high density dielectric barrier layer 112 may comprise a thickness of about 1 nm to about 6 nm. In an embodiment, the thickness of the high density dielectric barrier layer 112 may comprise a thickness of about 4 nm and below. In an embodiment, the high density dielectric barrier layer 112 may comprise a higher density then the low density dielectric material 110, and in some cases may comprise a density of about 2.0 to about 2.2 g/cm$^3$ or greater, and a k value of about 4.0 to about 7.5, and above. In an embodiment, the high density dielectric barrier material 112 may comprise such materials as SiC:H, SiCN:H, SiOC:H, SiNx:H, SiC:H, SiBN, BN, AlN, and combinations thereof.

The high density dielectric barrier layer 112 may serve as a moisture and or copper/metallic diffusion barrier, in some cases. Prior art dielectric capping/barrier/etch stop layers typically consist of a single dense film with a high dielectric constant or a dense bilayer with the dense layer being formed beneath the less dense layer. In contrast, the upper layer comprising the high density dielectric barrier layer 112 of the various embodiments herein provides a hermetic seal and is needed to prevent moisture and wet chemical diffusion into conductive interconnect structures 106, 106' and to prevent copper out diffusion into the surrounding upper interlayer dielectrics 114, for example.

The low density dielectric material 110 of the various embodiments herein provide a thicker low density (low-k) film 110 that is formed first on exposed copper and ILD material, followed by a thinner high density dielectric material 112. The low density/low-k dielectric layer serves as a planarizing layer reducing/eliminating surface topography/roughness that may have previously limited thickness scaling of a dense dielectric barrier layer. By reducing the thickness of the dense dielectric barrier, the impact of the high dielectric constant of this layer on the overall capacitance of an interconnect structure, such as the conductive structures 106' is reduced. Thus, a dual layer dielectric barrier/etch stop/capping layer 113 is formed on exposed conductive material and ILD surfaces, wherein the low density material 110 may comprise a different chemical composition than the high density dielectric barrier layer 112, in some cases, and may comprise an hermetic barrier layer 113.

Figure 1G:
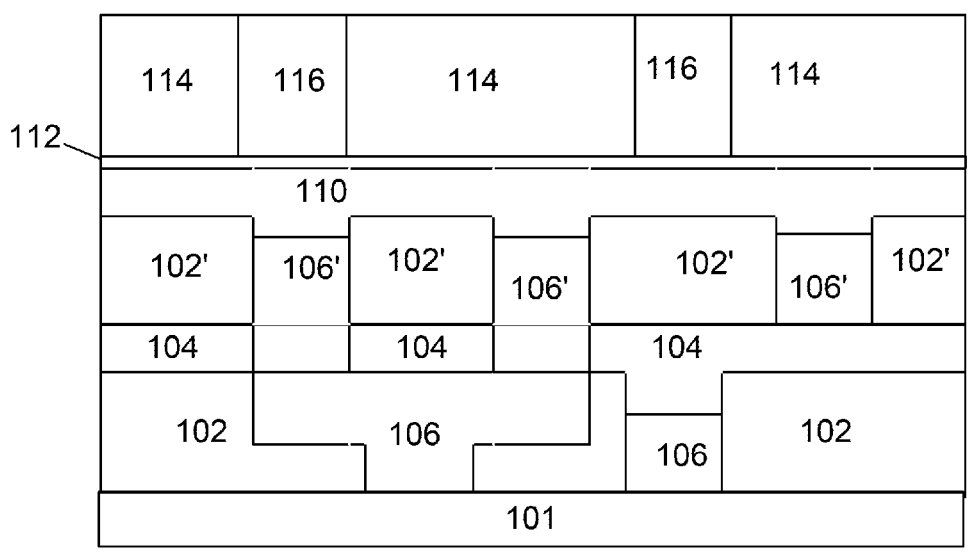

An additional ILD material 114 may be formed on the high density barrier layer 112, and suitable patterning, etching, and formation processes may be utilized to form additional inlaid conductive traces 116 on top of the high density barrier layer 112 (FIG. 1g). In an embodiment, the additional ILD 114 may comprise a second low k ILD layer 114 disposed on the first low k ILD layer and the additional conductive traces may comprise such materials as copper. The number of successive layers of inlaid conductive traces and ILD layers will vary depending upon the particular application.

Figure 1H:
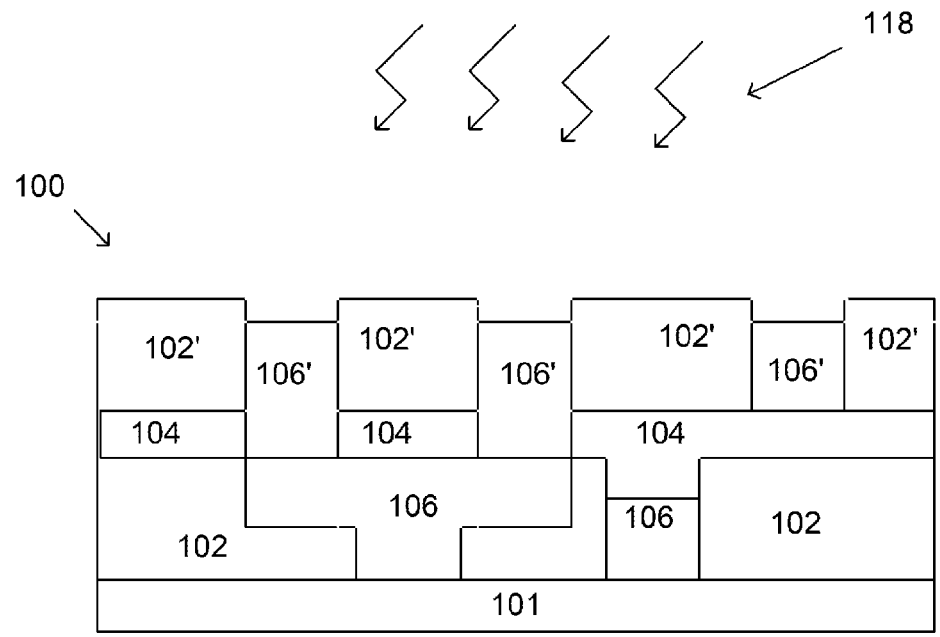

In another embodiment, the conductive traces 106' may be doped with elements comprising metals such as Be, B, Mg, Al, Si, V, Cr, Mn, Ge, for example, by using a doping process (FIG. 1h). The doping process may comprise a variety of methods including but not limited to forming the conductive traces 106' using targets previously doped with metallic and other suitable species metals and/or directly implanting 118 the conductive traces 106' with metallic and other suitable species after the conductive traces 106' have been formed.

Figure 1I:
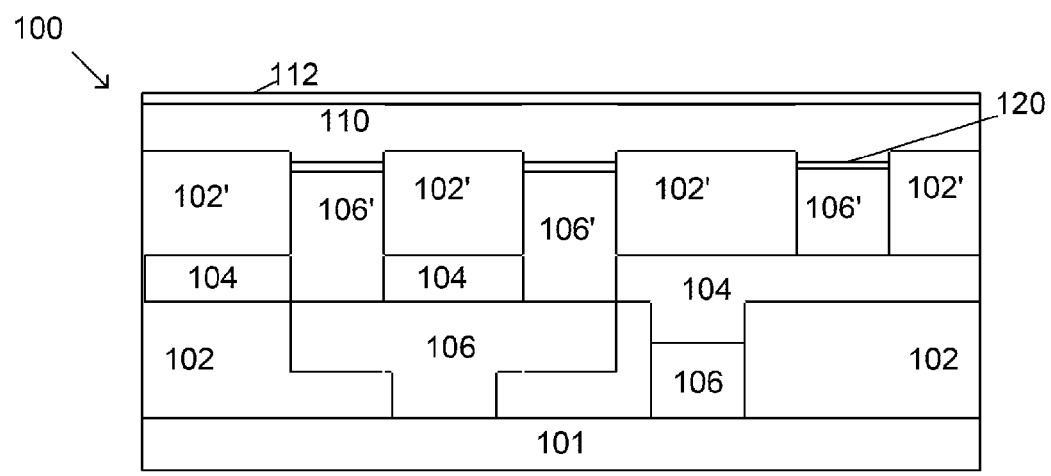

Subsequently, after the low density dielectric material 110 is formed on the doped conductive material 106', the low density dielectric material 110 may react with the dopant materials present in the conductive material 106'. A dopant surface interfacial layer 120 may be formed in between the low density dielectric material 110 and the doped conductive material 106' (FIG. 1i). In an embodiment, the dopant surface interfacial layer 120 may comprise MgO, AlOx, MnSiO4 surface passivation, in the case when the low density dielectric material 110 comprises SiOC:H. The dopant surface interfacial layer 120 may further comprise BN, SiN, VN and/or GeN in the case when the low density dielectric material 110 comprises SiCN:H and/or SIN:H in composition. This dopant surface/interfacial layer 120 passivates the surface of the conductive material 106' and minimizes copper electromigration. The high density dielectric barrier layer 112 may then be subsequently formed on the low density dielectric material 110, as in FIG. 1f, for example.

Figure 1J:
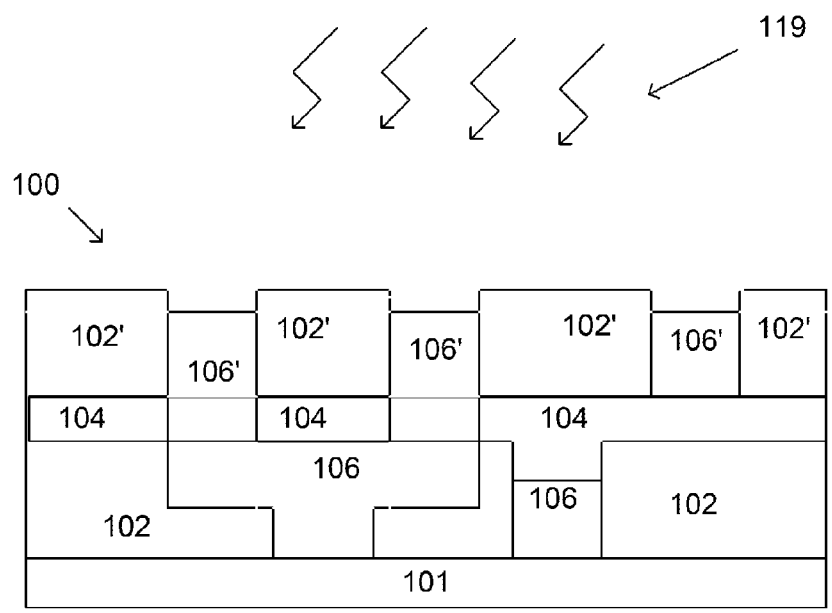
Figure 1K:
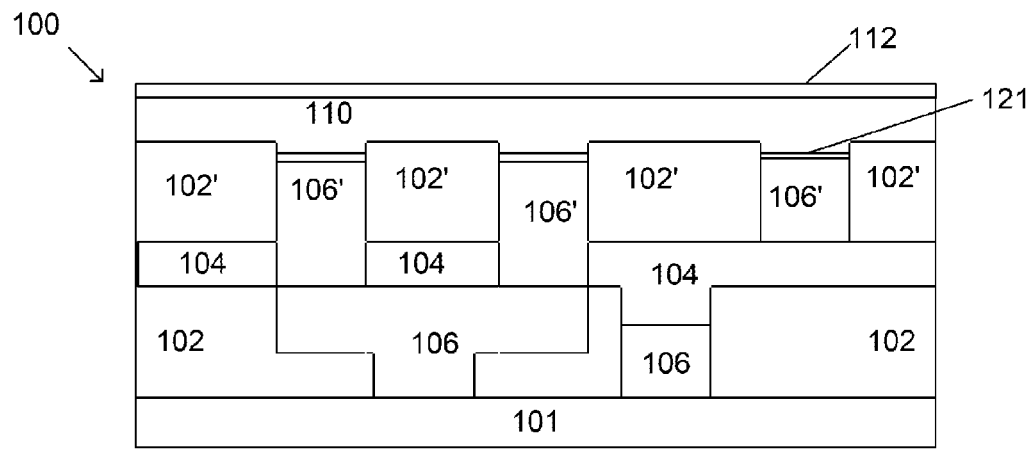

In another embodiment (FIG. 1j), the surface of the conductive trace 106' may be briefly exposed to a silicon hydride (SiH4., Si2H6, Si3H8), germanium hydride (GeH4, Ge2H6), and/or boron hydride (B2H6) process 119 either before or after an in-situ plasma surface clean, such as the plasma clean 108 of FIG. 1d, for example. The boron/silicon/germanium hydride exposure may create a hydride surface interface layer 121 (FIG. 1k) that may comprise a CuB, CuSix, CuGex layer that may be subsequently converted to CuBN, CuSiN, and/or CuGeN passivation layer by a nitrodizing plasma treatment, for example. In the case when a plasma clean is performed prior to the B/Si/Ge hydride exposure, the nitrodizing plasma clean (such as the plasma clean 108) may represent an additional plasma treatment. The formed CuSiN, CuBN or CuGeN hydride surface/interfacial layer 121 passivates the conductive material 106' surface to minimize electromigration, such as copper electromigration for example. The low density dielectric material 110 may be subsequently formed on the hydride surface interface layer 121, and the high density dielectric barrier layer 112 may then be subsequently formed on the low density dielectric material 110, as in FIG. 1f, for example.

Figure 1L:
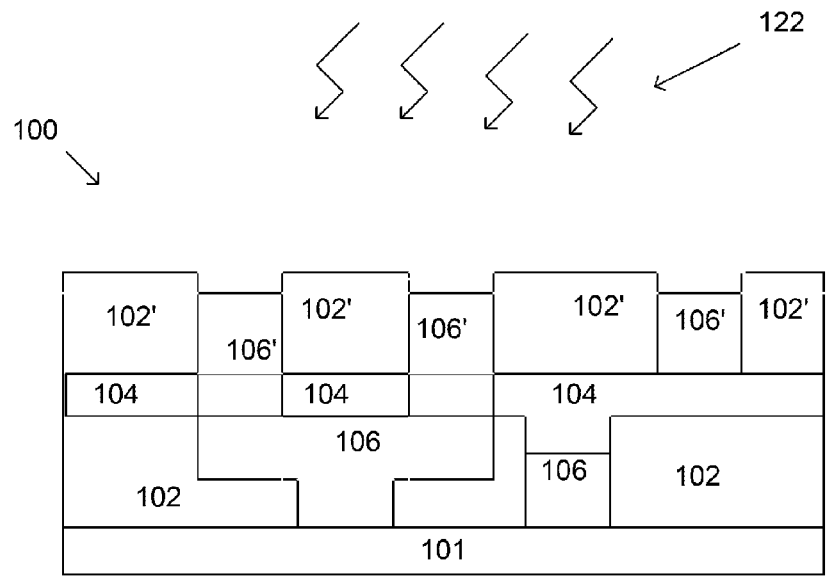
Figure 1M:
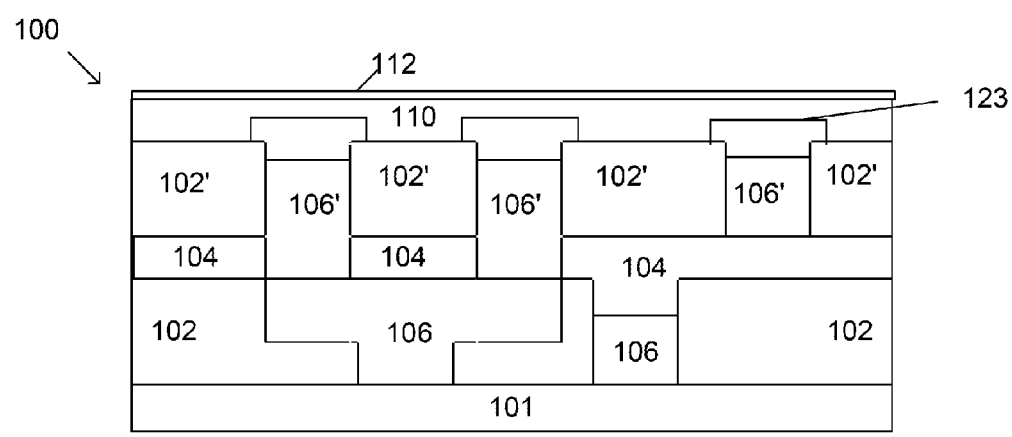

In another embodiment, the surface of the conductive material 106' may be selectively capped with another, different metal, such as but not limited to cobalt, via methods such as a selective electroless metal deposition process 122, for example (FIG. 1l). After selective deposition and formation of a metal cap 123 on the conductive material 106', the low density dielectric material 110 may be formed on the capped conductive material 106' (FIG. 1m). The low density dielectric material 110 may serve to planarize the positive topography that may be created by the metal cap layer 123 formed on the conductive material 106'. The high density dielectric barrier layer 112 may then be subsequently formed on the low density dielectric material 110, as in FIG. 1f, for example.

Figure 2A:
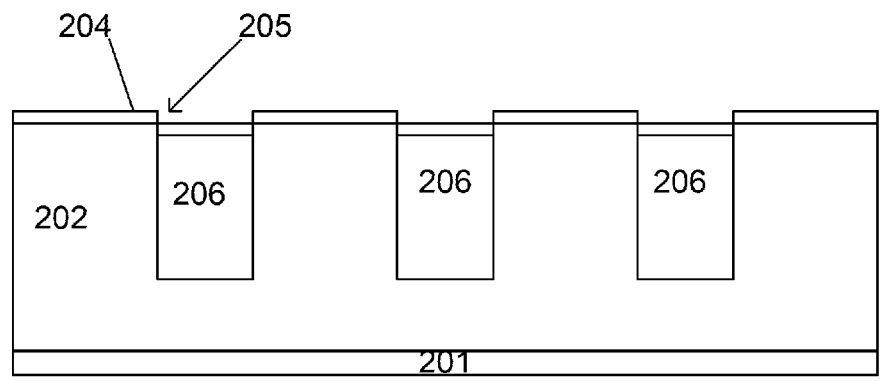
FIGS. 2a-2b represent cross-sections of structures from the Prior Art.
Figure 2B:
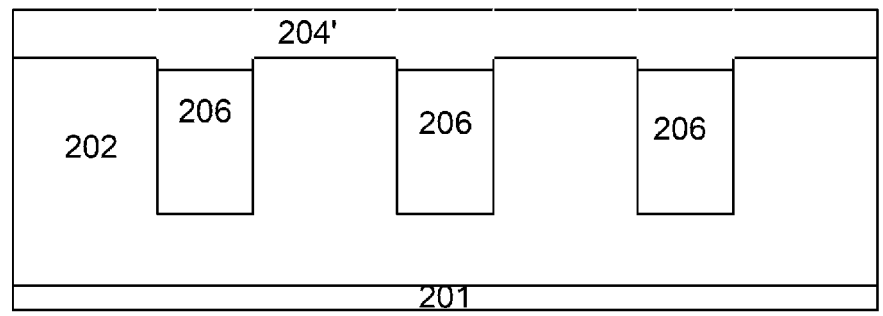

FIGS. 2a-2b depicts structures of the prior art, wherein a conductive material 206 is disposed within a dielectric material 202 disposed on a substrate 201. A dielectric barrier 204 is disposed on the conductive material 206 and on the dielectric material 202 (FIG. 2a). Due to poor step coverage and poor conformality of prior art dielectric barrier films 204, such as prior art dielectric barrier films 204 formed by PECVD for example, the prior art dielectric barrier 204 does not cover all surface topography of the underlying structure. Consequently seems 205 located near interfaces of the dielectric material 202 and conductive material 206 may exist through which moisture and wet chemicals can easily pass. In other prior art cases, in order to ensure that all surface topography is covered, a thicker dielectric barrier 204' has been employed, which has a negative impact on the conductive interconnect 206 capacitance (FIG. 2b). Thus both copper corrosion and greater RC delay appears to be exhibited in structures utilizing prior art diffusion barrier layers.

Prior art dielectric barrier layers have further attempted to reduce Interconnect capacitance by decreasing the dielectric constant of the interlayer dielectric (ILD) by reducing density or in more extreme cases introducing controlled levels of porosity. This, however, significantly degrades the ability of the dielectric barrier material to function as a diffusion barrier and significantly weakens the material. Integrating low density or porous low-k barrier materials has proven extremely challenging.

As described above, the methods of the present invention enable continued scaling of the thickness of barrier/capping/etch stop layers in back end copper/conductive interconnects. As the line dimensions and spacing of such interconnects continue to decrease, the dielectric constant of the interlayer dielectric materials must be decreased to minimize RC delay. The high dielectric constant of the dense dielectric barriers utilized in the prior art structures can represent up to 10% of the total capacitance of these structures. Embodiments included herein reduce the RC delay by reducing the thickness of the high density portion of the dielectric barrier.

Although the foregoing description has specified certain steps and materials that may be used in the method of the present invention, those skilled in the art will appreciate that many modifications and substitutions may be made. Accordingly, it is intended that all such modifications, alterations, substitutions and additions be considered to fall within the spirit and scope of the invention as defined by the appended claims. In addition, it is appreciated that the fabrication of various layers within a substrate, such as a silicon substrate, to manufacture a microelectronic device is well known in the art. Therefore, it is appreciated that the Figures provided herein illustrate only portions of an exemplary microelectronic device that pertains to the practice of the present invention. Thus the present invention is not limited to the structures described herein.

What is claimed is:

1. A method comprising:
   forming a conductive material that is configured to include at least one of a dopant surface interface layer, a hydride surface interface layer, and a metal cap, the conductive material is formed in an interconnect opening within an interlayer dielectric material that is disposed on a substrate;
   forming a low density dielectric material on a surface of the interlayer dielectric layer and on a surface of the conductive material; and
   forming a high density dielectric barrier layer on the low density dielectric layer.

2. The method of claim 1 further comprising wherein the high density dielectric barrier layer comprises a k value of about 4.0 and above.

3. The method of claim 2 further comprising wherein the low density dielectric material planarizes a surface of the conductive material and the surface of the interlayer dielectric material.

4. The method of claim 1 further comprising wherein the low density dielectric layer comprises a k value of about 3.3 and below.

5. The method of claim 1 further comprising wherein the high density barrier is about less than about ¼ of the thickness of the low density dielectric material.

6. The method of claim 1 wherein additional interlayer dielectric material is formed on the high density dielectric barrier layer.

7. The method of claim 1 further comprising wherein the low density dielectric material comprises at least one of SiC:H, SiCN:H, SiOC:H, SiNx:H, SiC:H, SiBN, BN, and AlN.

8. The method of claim 1 further comprising wherein the surface of the interlayer dielectric layer and the surface of the conductive material are exposed to a plasma process comprising at least one of H2, NH3, N2, and Ar.

9. The method of claim 1 further comprising wherein the low density dielectric comprises a density less than about 1.5 g/cm3 and a k value less than about 4.0.

10. The method of claim 1 further comprising wherein the high density dielectric layer comprises a density greater than about 2.0 g/cm3 and a thickness of about 1 to about 6 nm.

* * * * *